United States Patent
Mishra et al.

(10) Patent No.: US 12,126,117 B2
(45) Date of Patent: Oct. 22, 2024

(54) MODULE CONNECTOR DAMAGE DETECTION AND CONTROLLED INSERTION

(71) Applicant: Cisco Technology, Inc., San Jose, CA (US)

(72) Inventors: Garima Mishra, Bangalore (IN); Rohit Dev Gupta, Bangalore (IN); Shilpa Agrawal, Bangalore (IN); Manjunatha Reddy Shivashankara, Bangalore (IN); Ramesh Babu Darla, Bengaluru (IN)

(73) Assignee: Cisco Technology, Inc., San Jose, CA (US)

( * ) Notice: Subject to any disclaimer, the term of this patent is extended or adjusted under 35 U.S.C. 154(b) by 340 days.

(21) Appl. No.: 17/659,987

(22) Filed: Apr. 20, 2022

(65) Prior Publication Data

US 2023/0344172 A1  Oct. 26, 2023

(51) Int. Cl.
*H01R 13/64* (2006.01)
*H01R 13/66* (2006.01)
*H01R 13/717* (2006.01)

(52) U.S. Cl.
CPC ......... *H01R 13/64* (2013.01); *H01R 13/6683* (2013.01); *H01R 13/7175* (2013.01)

(58) Field of Classification Search
CPC . H01R 13/64; H01R 13/6683; H01R 13/7175
USPC ................. 439/135, 488, 489, 348
See application file for complete search history.

(56) References Cited

U.S. PATENT DOCUMENTS

| | | | | |
|---|---|---|---|---|
| 7,001,199 B1 * | 2/2006 | Badalpour | ......... | H01R 13/6276 439/348 |
| 7,125,273 B2 * | 10/2006 | Irwin | ................. | H01R 13/7137 439/348 |
| 2009/0255352 A1 * | 10/2009 | Draper | ............... | H01R 13/5219 73/866.5 |
| 2010/0203764 A1 * | 8/2010 | Chang | ..................... | A61P 25/00 439/625 |
| 2016/0103169 A1 * | 4/2016 | Nakajima | .......... | G06K 19/0723 324/538 |

(Continued)

FOREIGN PATENT DOCUMENTS

DE    102011080456 A1    2/2013

OTHER PUBLICATIONS

Unkown, "AOI, Automated Optical Inspection for Pin Fault Detection in Backplanes," Abto Software, Date Acessed Apr. 15, 2022 https://www.aAbtosoftware.com/blog/aoi-automated-optical-inspection-for-pin-fault-detection-in-backplanes <https://www.abtosoftware.com/blog/aoi-automated-optical-inspection-for-pin-fault-detection-in-backplanes>.

(Continued)

*Primary Examiner* — Gary F Paumen
(74) *Attorney, Agent, or Firm* — Patterson + Sheridan, LLP

(57) ABSTRACT

Embodiments herein describe preventing a pluggable module from connecting to a chassis until ensuring there is no damage on the pluggable module, the chassis, or both. In one embodiment, the chassis includes a blocking element that prevents or blocks the pluggable module from mating with the chassis. The chassis can also include a camera for capturing an image of the pluggable module to determine whether there is damage to its connection elements (e.g., pins). If not, the chassis can release the locking pin to permit the pluggable module to mate with connection elements on the chassis.

20 Claims, 9 Drawing Sheets

(56) References Cited

U.S. PATENT DOCUMENTS

| | | |
|---|---|---|
| 2016/0254613 A1 | 9/2016 | Choi et al. |
| 2017/0102606 A1* | 4/2017 | Pavis .................. H01R 13/24 |
| 2018/0091707 A1 | 3/2018 | Jannard |
| 2020/0047221 A1* | 2/2020 | Gisler .................. H04N 23/56 |
| 2020/0049942 A1* | 2/2020 | Gisler ................ G02B 27/143 |
| 2021/0111519 A1 | 4/2021 | Schneider et al. |
| 2021/0119389 A1 | 4/2021 | Kropiewnicki |
| 2022/0069484 A1* | 3/2022 | Yang .................... G01N 21/01 |

OTHER PUBLICATIONS

Yann Armand et al., "Detecting and Measuring bent pins on electronic components," SPIE. The international society for optics and photonics, Dated Oct. 7, 2009 <https://spie.org/news/1808-detecting-and-measuring-bent-pins-on-electronic-components?SSO=1>.

Unkown, "Avoiding Connector and Backplane Damage During CRU/FRU Replacement," Date Accessed: Apr. 15, 2022 https://usermanual.wiki/Hp/HpIntegrityNonstopServiceProceduresServiceAndMaintain669463.1390756611.pdf>.

Cisco.com, "Module Insertion Best Practices in Catalyst 6500 Chassis," dated Oct. 19, 2016, pp. 1-11 https://www.cisco.com/c/en/us/support/docs/switches/catalyst-6500-series-switches/200114-Module-Insertion-Best-Practices-In-Catal.html

* cited by examiner

MODULE CONNECTOR DAMAGE DETECTION AND CONTROLLED INSERTION

TECHNICAL FIELD

Embodiments presented in this disclosure generally relate to detecting damage in a pluggable module. More specifically, embodiments disclosed herein prevent insertion of a pluggable module in a chassis until determining the pluggable module, the chassis, or both are undamaged.

BACKGROUND

Many computing devices such as networking devices (e.g., routers, switches, etc.) and servers (e.g., blade servers) have modular chassis with few or many modular slots to which pluggable modules are connected. In many connection systems, the pluggable modules include pins that are connected into corresponding receptacles on the chassis. But if these pins are bent, they may plug into the wrong receptacles or otherwise cause a short circuit that can damage the computing device and the pluggable module. In general, a wrong insertion could lead to connector damage on either the chassis or the pluggable module. Thereafter if a damaged module is re-inserted into a good slot of the same or other chassis, or a good module is inserted into damaged slot of the chassis, the damage can continue to spread.

While the damage could have been avoided by a technician viewing the pins before insertion to ensure there is no damage, this is not often done, resulting in damage to the computing device. Further, design flaws can disturb the alignment of the pins to sockets due to the push and tremble during the insertion which displaces the chassis and also can lead to damage.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
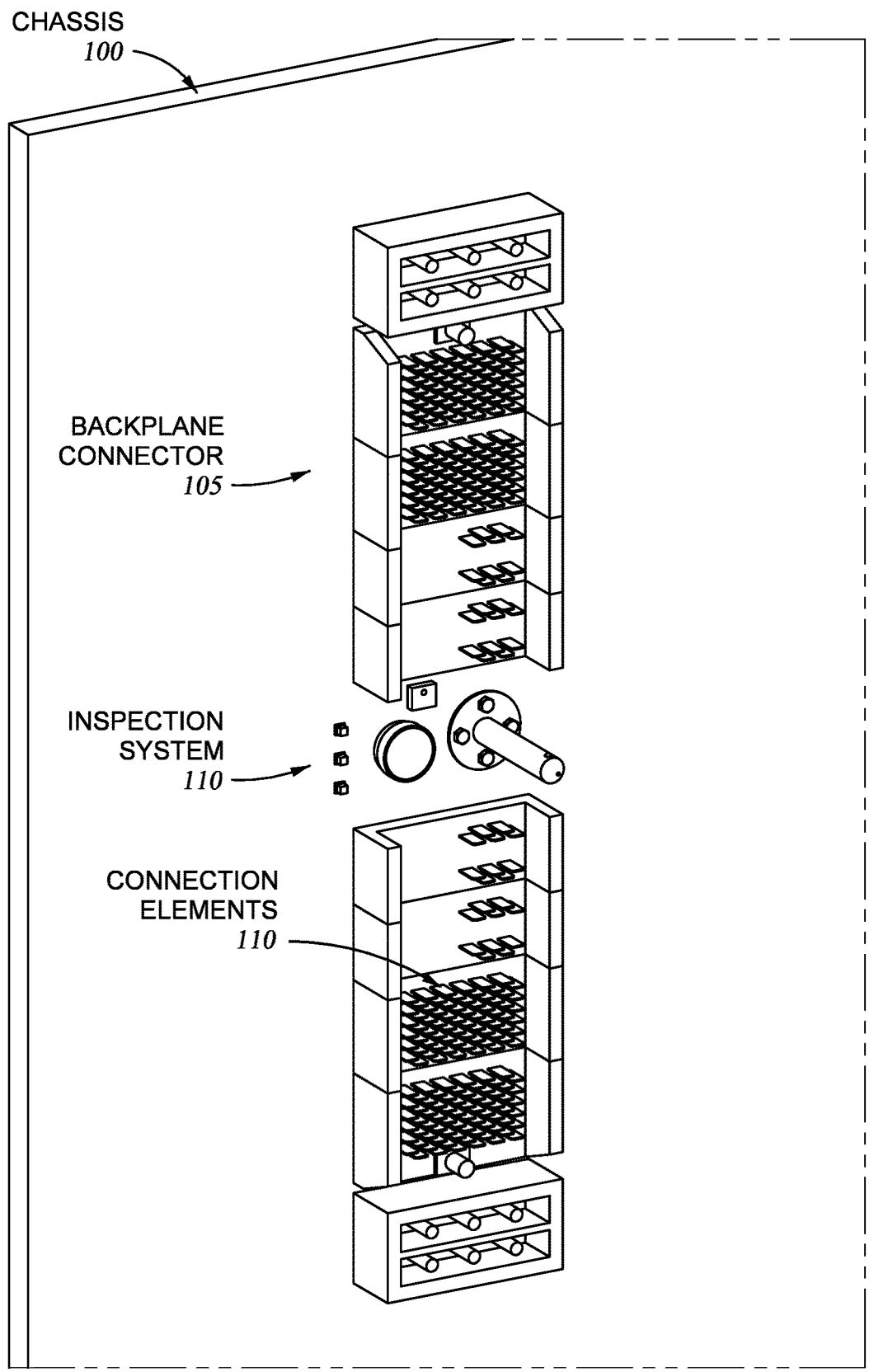
FIG. 1A illustrates a backplane connector for a chassis of a computing device, according to one embodiment.

One embodiment presented in this disclosure is a method that includes detecting that a module is proximate to a computing device, activating a blocking element to prevent a first connector element in the module from mating with a second connector element in the computing device, while the blocking element is activated, capturing an image of at least one of the first connector or the second connector, and upon determining, using an image processing system, that the at least one of the first connector or second connector is not damaged, releasing the blocking element, thereby permitting the first connector to mate with the second connector.

Another embodiment is a computing device that includes a first connector element configured to mate with a second connector element on a pluggable module, a camera configured to capture images of the second connector element before the pluggable module mates with the first connector element, a blocking element configured to prevent the first connector element from mating with the second connector element in the pluggable module, an image processing system configured to evaluate the images to determine whether there is damage on the pluggable module where the computing device is configured to release the blocking element in response to determining there is no damage on the pluggable module.

Another embodiment is a system that includes a computing device, a pluggable module where a first connector element on the computing device is configured to mate with a second connector element on the pluggable module, a camera configured to capture images of the computing device or the pluggable module before the pluggable module mates with the first connector element, a blocking element disposed on the computing device or the pluggable module, the blocking element is configured to prevent the first connector element from mating with the second connector element in the pluggable module, and an image processing system configured to evaluate the images to determine whether there is damage on the computing device or the pluggable module where the computing device is configured to release the blocking element in response to determining there is no damage on the computing device or the pluggable module.

EXAMPLE EMBODIMENTS

Embodiments herein describe preventing a pluggable module from connecting to a chassis until ensuring there is no damage on the pluggable module, the chassis, or both. In one embodiment, the chassis includes a blocking element that prevents or blocks the pluggable module from mating with the chassis. For example, the blocking element (e.g., a locking pin) may protrude from a connection interface of the chassis to prevent the pluggable module from mating with the chassis. The chassis can also include a camera for capturing an image of the pluggable module to determine whether there is damage to its connection elements (e.g., pins). If not, the chassis can release the locking pin to permit the pluggable module to mate with the connection interface.

In other embodiments, a camera is disposed on the pluggable module to capture an image of the connection interface of the chassis to ensure there is no damage. The pluggable module can then inform the chassis there is no damage, which results in the chassis releasing the locking pin so the pluggable module can be plugged into the chassis. In this manner, the embodiments herein can inspect the pluggable module, the chassis, or both to determine whether there is damage to one device before the devices are mated. This prevents the damaged device from then harming the other, undamaged device.

FIG. 1A illustrates a backplane connector 105 for a chassis 100 of a computing device, according to one embodiment. In one embodiment, the computing device may be a networking device such as a router, switch, and the like. In another embodiment, the computing device may be a server such as a blade server. In one embodiment, the chassis 100 is rack mountable, although this is not a requirement.

The backplane connector 105 includes connection elements 150 such as pins and electrical receptacles or sockets. The connection elements 150 are arranged to mate with a pluggable module (not shown). The pluggable module can be any device that receives data signals or power from the chassis 100. In one embodiment, a male/female connection system may be used where the backplane connector 105 includes female connection elements (e.g., receptacles or sockets) while the pluggable module includes male connection elements (e.g., pins). In another embodiment, the backplane connector 105 includes male connection elements while the pluggable module includes female connection elements. In yet another embodiment, the backplane connector 105 and the pluggable both include a mix of male and female connection elements.

FIG. 1A shows that an inspection system 110 is disposed on the backplane connector 105. In this example, the inspection system 110 is disposed between two portions of the backplane connector 105 (e.g., in the middle), but in other embodiments the inspection system 110 can disposed at any location that provides a view of the pluggable module. In this example, the top half of the backplane connector 105 may be used to connect to a first half of the pluggable module while the bottom half of the backplane connector 105 is used to connect to a second half of the pluggable module. Thus, when connecting the pluggable module to the backplane connector 105 (which is shown in more detail in FIGS. 2A-2C), the inspection system 110 has a facing relationship with the pluggable module. Further, the backplane connector 105 can have multiple inspection systems 110 to help inspect the pluggable module for damage. A closer view of the inspection system 110 is provided in FIG. 1B.

Figure 1B:
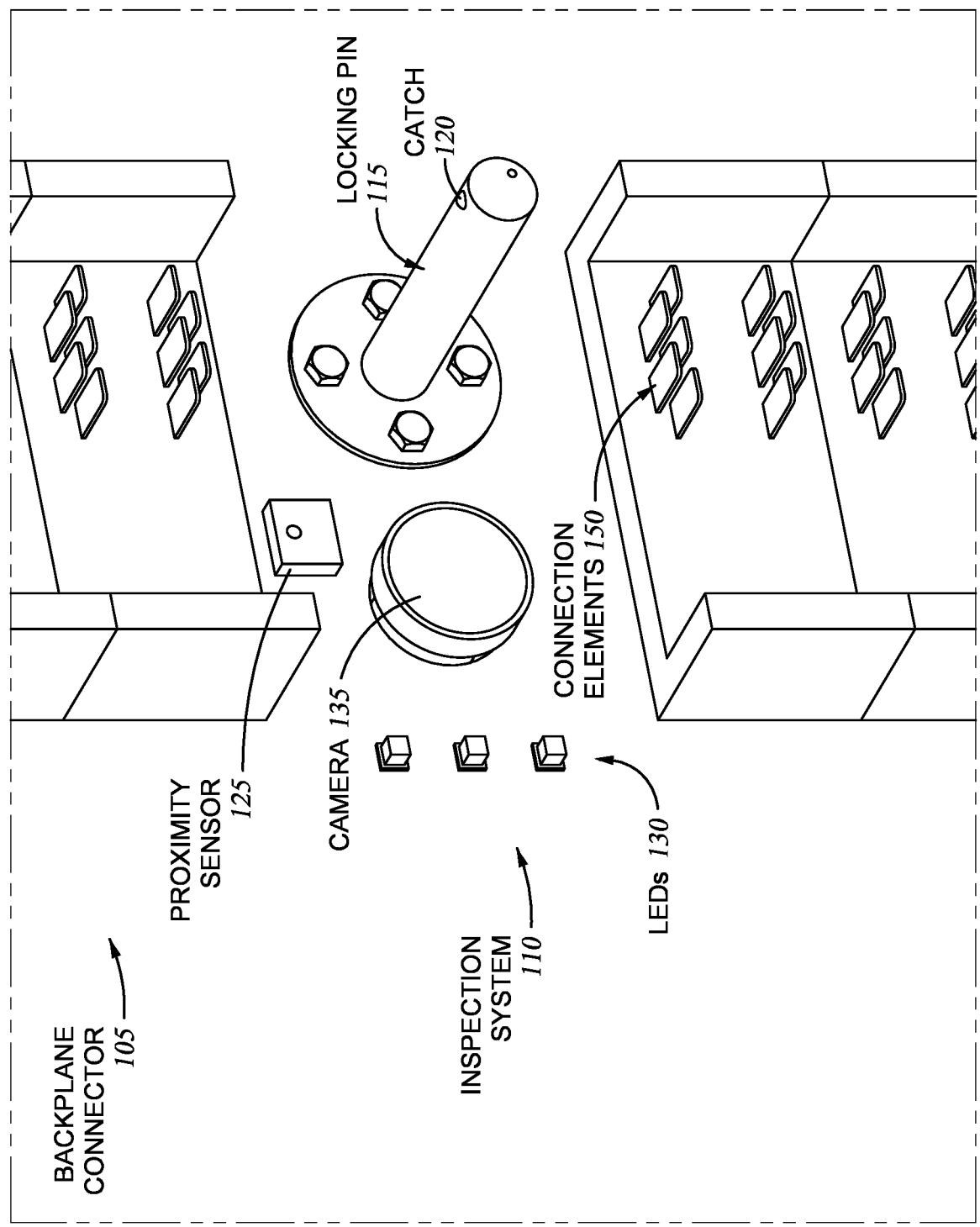
FIG. 1B illustrates an inspection system on the backplane connector illustrated in FIG. 1A, according to one embodiment.

FIG. 1B illustrates the inspection system 110 illustrated in FIG. 1A, according to one embodiment. The inspection system 110 includes a locking pin 115 that includes multiple catches 120, a proximity sensor 125, light emitting diodes (LEDs) 130, and a camera 135. As shown, the locking pin 115 protrudes from the backplane connector on the chassis. In one embodiment, the pluggable module has to first contact the locking pin 115 before the module is able to contact other portions of the backplane connector. Thus, the locking pin 115 can prevent the pluggable module from contacting electrically and physically sensitive elements in the backplane module (e.g., the connection elements 150) before the inspection system 110 has determined there is no damage to the pluggable module.

In this example, the catches 120 prevent the pluggable module from mating with the backplane connector. FIG. 1B illustrates the catches 120 in an "activated" position where the catches 120 (e.g., balls) protrude from the cylindrical side of the locking pin 115. For example, the pluggable module may include a cylindrical receptacle that is design to mate with the locking pin 115. However, the diameter of the receptacle in the pluggable module is set so the locking pin 115 cannot be inserted into the receptacle unless the catches 120 are recessed into the locking pin 115 (e.g., the catches 120 are moved to a "released" position). If the catches 120 are recessed, then the pluggable module is able to slide over the locking pin 115 and mate with the connection elements in the backplane connector. The details of the locking pin 115 and the catches 120 are provided in FIGS. 4A and 4B.

The proximity sensor 125 detects when the pluggable module is brought near to the backplane connector. In response, the proximity sensor 125 can activate the catches 120 proximate to the end of the pin 115 as shown in FIG. 1B so the catches 120 prevent a technician from mating the pluggable module to the backplane connector. Moreover, the proximity sensor 125 can then activate the camera 135 which may have been in a lower power state to then capture an image of the pluggable module. An image processing system (e.g., a software application executing on the computing device, or elsewhere such as a cloud computing environment) can then process the image to confirm there is no damage to the pluggable module (e.g., a bent pin). The proximity sensor 125 can also activate the LEDs 130 (or other suitable light source) to illuminate the pluggable module to produce a higher quality image using the camera 135. That is, because the backplane of the chassis may in an area that is poorly illuminated, the LEDs 130 can provide additional illumination to ensure the image processing system has a high quality image in order to perform the inspection.

Figure 5:
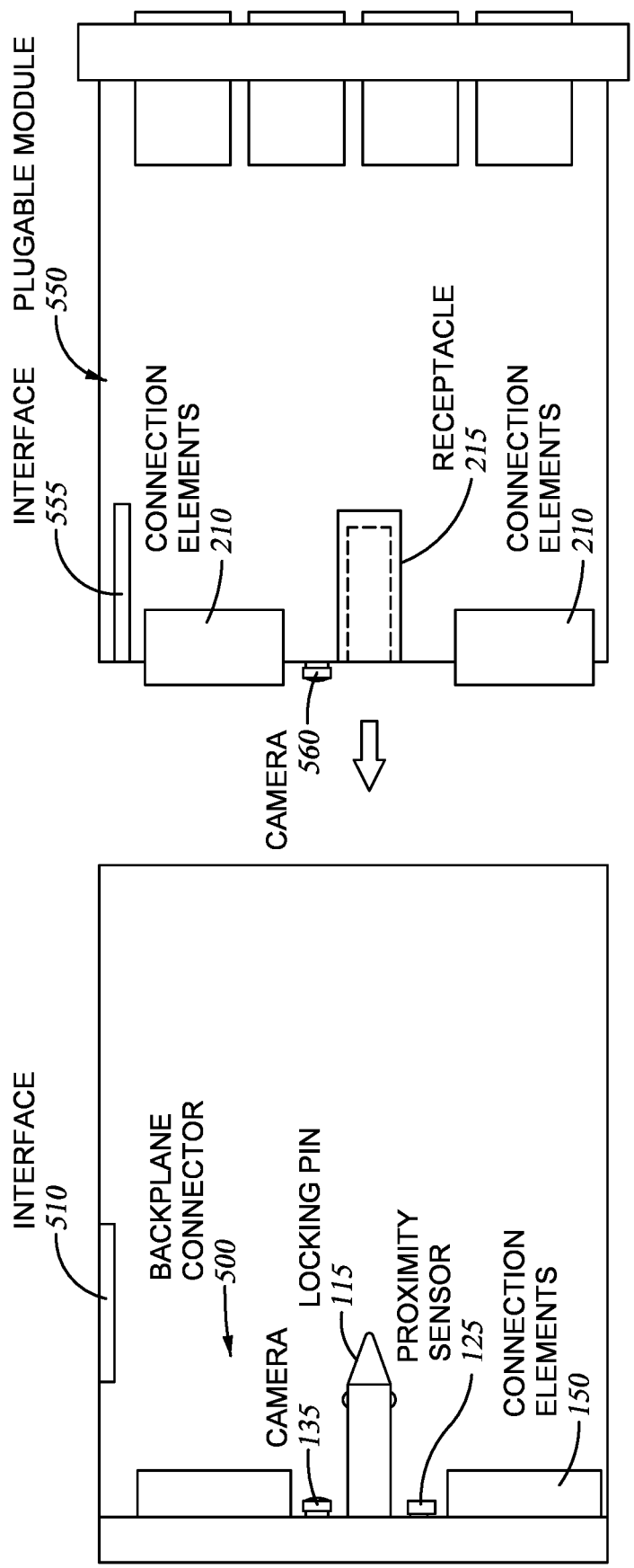
FIG. 5 illustrates an inspection system with a camera on the pluggable module, according to one embodiment.

In one embodiment, the proximity sensor may be omitted. For example, the camera 135 can be used to capture images of the environment which the image processing system can then evaluate to determine when a pluggable module is proximate to the backplane connector (i.e., when a technician is attempting to connect the pluggable module to the chassis). In this example, the camera 135 along with the image processing system serve as the proximity detector. Further, FIG. 5 illustrates another embodiment where a camera can be disposed on the pluggable module in addition to, or instead of, the camera 135 being disposed on the chassis.

Figure 2A:
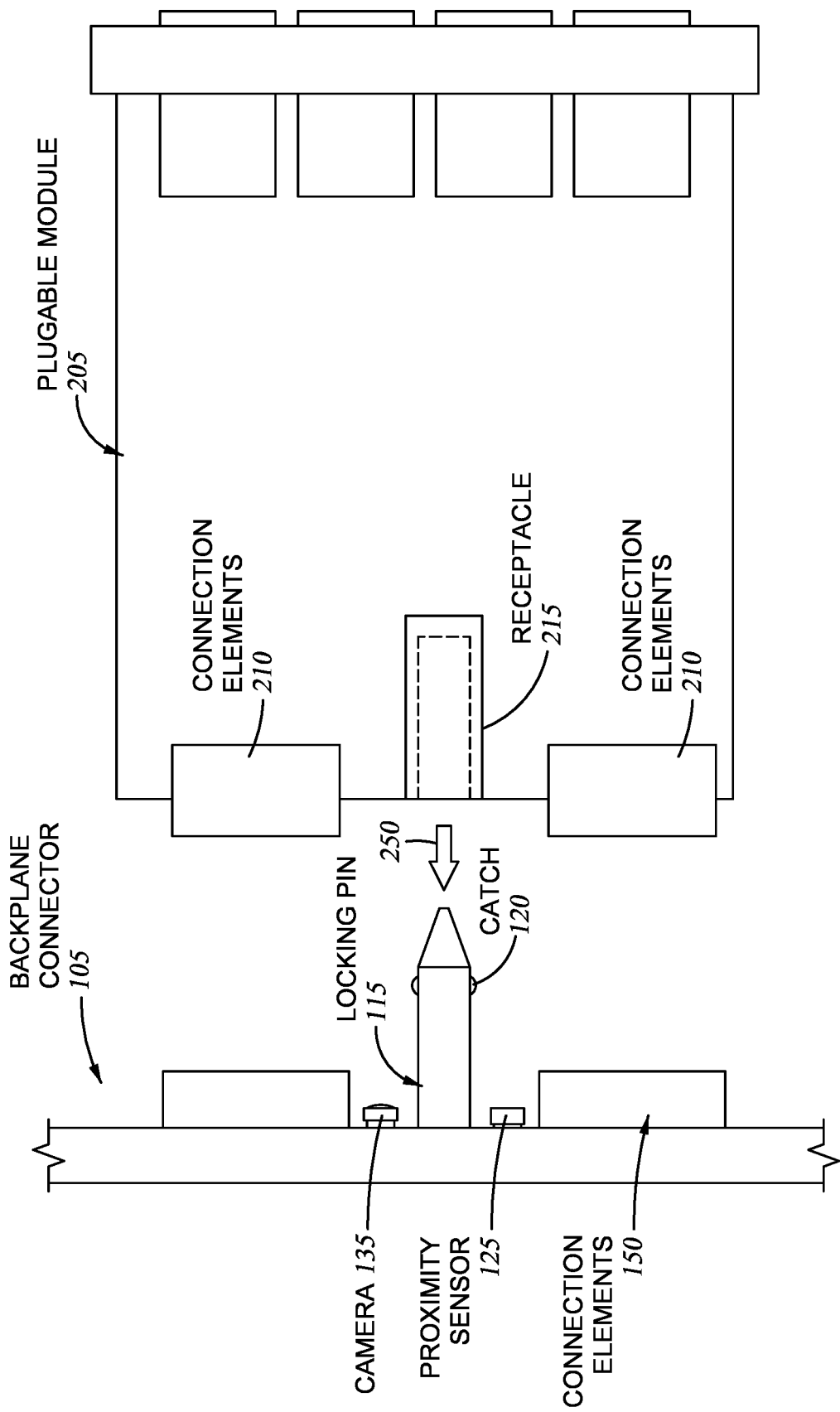
FIG. 2A illustrates a pluggable module proximate to a backplane connector, according to one embodiment.

FIG. 2A illustrates a pluggable module 205 proximate to the backplane connector 105 illustrated in FIG. 1A, according to one embodiment. The pluggable module 205 may be a line card, input/output (I/O) device (e.g., a PCIe card), accelerator card, and the like. However, in general, the pluggable module 205 can be any computing element that can be plugged into a computing device, such as a cable with pins.

FIG. 2A illustrates a side view of the backplane connector 105 where the rest of the chassis is disposed to the left of the connector 105 (and is not shown). Arrow 250 illustrate the pluggable module 205 being brought into a mating position with the backplane connector 105, where the locking pin 115 on the backplane connector 105 is aligned with a receptacle 215 on the pluggable module 205.

In one embodiment, FIG. 2A represents a time where the proximity sensor 125 on the backplane connector 105 has detected the pluggable module 205 and activated the locking pin 115 to prevent the pluggable module 205 from contacting the connection elements 150 on the backplane connector 105. As shown, the catches 120 near the tip of the locking pin 115 are extended such that the distance the locking pin 115 can extend into the receptacle 215 is limited. That is, with the catches 120 in the activated position, the catches 120 contact the mouth of the receptacle 215 to prevent anything but the tip of the locking pin 115 from extending into the receptacle 215. Stated differently, the catches 120 extend beyond the diameter of the receptacle 215 such that the catches 120 cannot be inserted into the receptacle 215 when in the activated position. Thus, as the technician moves the pluggable module 205 in the direction of the arrow 250, eventually the catches 120 contact the mouth of the receptacle 215 and prevent the pluggable module 205 and the backplane connector 105 from coming any closer to each other.

Figure 2B:
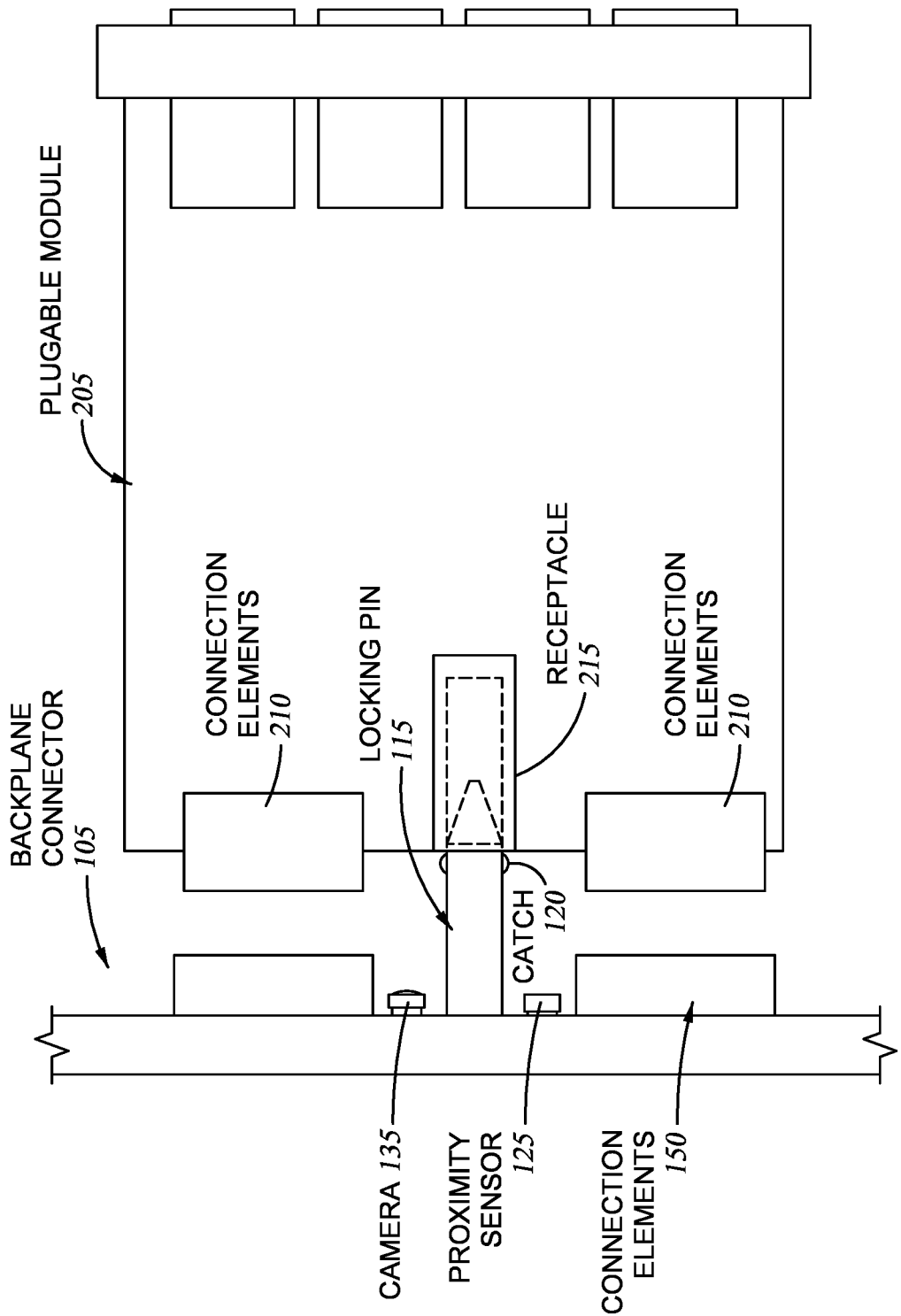
FIG. 2B illustrates preventing the pluggable module from connecting to the backplane connector, according to one embodiment.

FIG. 2B illustrates preventing the pluggable module 205 from connecting to the backplane connector, according to one embodiment. This figure illustrates when the mouth of the receptacle 215 contacts the catches 120 on the locking pin 115, thereby preventing the connection elements 210 on the pluggable module 205 from contacting the connection elements 150 on the backplane connector 105. Thus, if there is damage on the connection elements 210 (or the connection elements 150 as discussed in FIG. 5), the locking pin 115 prevents the connection elements 210 from potentially damaging the backplane connector 105. In one embodiment, an indication (through LED or console) is given to the technician to remove the faulty pluggable module and replace with an undamaged module.

At the position shown in FIG. 2B, the camera 135 may capture an image (or several images) of the connection elements 210 on the pluggable module 205. An image processing system can then evaluate the images to determine whether there is any damage on the connection elements 210 (e.g., a bent pin, a foreign object, a broken female connection element, and the like). One advantage of permitting the tip of the locking pin 115 to be inserted into the receptacle 215 before contacting the catches 120 is doing so aligns the pluggable module 205 with the backplane connector 105 and can provide some stability as the camera 135 captures the images. It also establishes a separation distance and a rough alignment that ensure that the connection elements 210 are within the field of view of the camera 135 so the image processing system can ensure there is no damage.

After confirming there is no damage, the backplane connector 105 can release the catches 120 so they are recessed inside of the locking pin 115. This permits the remaining portion of the locking pin 115 to slide into the receptacle 215 until the connection elements 150 on the backplane connector 105 can mate with the connection elements 210 on the pluggable module 205. However, if the image processing system detects damage, the backplane connector 105 keeps the catches 120 in the activated position to ensure the damaged connection elements 210 cannot contact the connection elements 150.

Figure 2C:
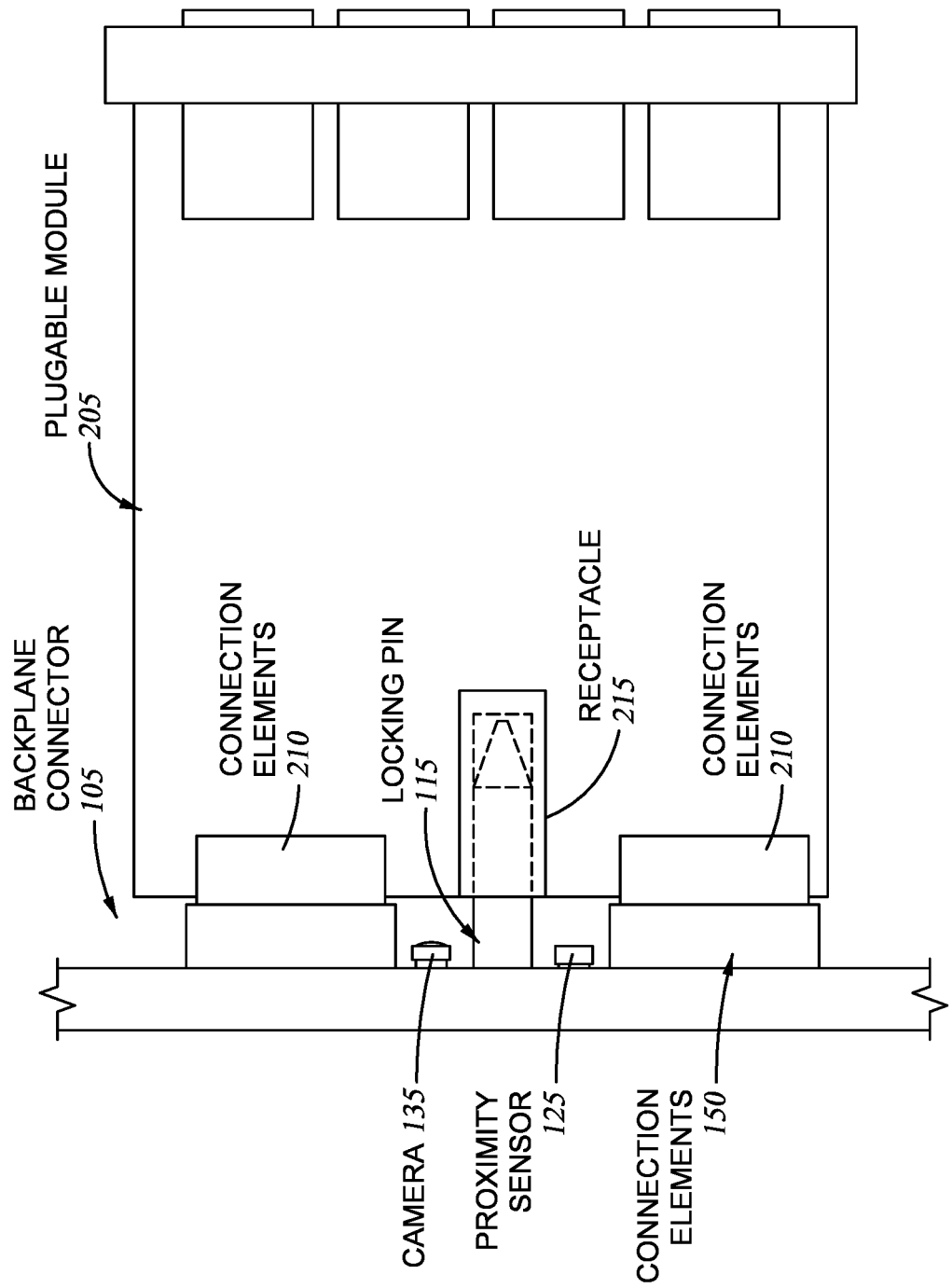
FIG. 2C illustrates mating the pluggable module to the backplane connector, according to one embodiment.

FIG. 2C illustrates mating the pluggable module to the backplane connector, according to one embodiment. FIG. 2C assumes the image processing system has confirmed there is no damage to the connection elements 210. Once the catches 120 are recessed (and a visual indication (example through an LED or console) is given to continue with the module installation), the technician can slide the locking pin 115 into the receptacle 215 to mate the connection elements 150 with the connection elements 210. As discussed above, a male/female connection system may be used where the connection elements 150 on the backplane connector 105 includes female connection elements (e.g., receptacles or sockets) while the connection elements 210 on the pluggable module 205 includes male connection elements (e.g., pins). In another embodiment, the connection elements 150 includes male connection elements while the connection elements 210 includes female connection elements. In yet another embodiment, the connection elements 150 and the connection elements 210 both include a mix of male and female connection elements.

Figure 3:
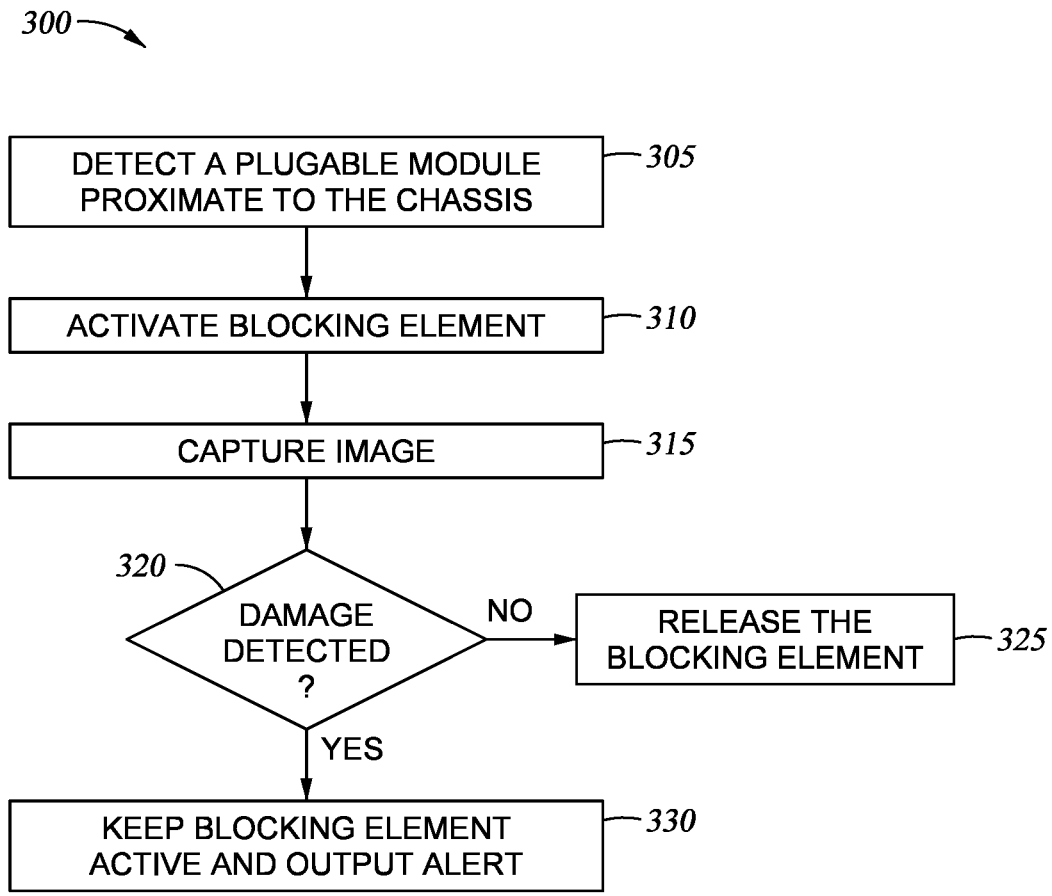
FIG. 3 is a flowchart for preventing a pluggable module from connecting to a chassis until performing an inspection, according to one embodiment.

FIG. 3 is a flowchart of a method 300 for preventing a pluggable module from connecting to a chassis until performing an inspection, according to one embodiment. At block 305, a proximity sensor detects a pluggable module proximate to the chassis. For example, the proximity sensor may use an electromagnetic field or a beam of electromagnetic radiation (e.g., infrared) to detect the presence of the pluggable module. In one embodiment, an inductive proximity sensor may be used if the pluggable module has sufficient metal on its side that faces the backplane connector in order for the inductive proximity sensor to detect the pluggable module. Alternatively, a capacitive proximity sensor or photoelectric proximity sensor may be used. In another embodiment, a depth camera may be used to identity when the pluggable module comes into a predefined distance or range from the chassis.

In another embodiment, instead of having a separate proximity sensor, the camera that is used to capture images of the pluggable module to detect damage can also capture images that are processed to determine when a pluggable module has been moved within a threshold distance from the backplane connector. For example, in a low power state, the camera may capture images at a lower rate (e.g., once every half a second) or at a lower quality that are then processed by the image processing system to determine whether a technician is moving a pluggable module closer to the chassis. The camera can then switch to a high power state where it captures images at an increased rate or at a higher quality (e.g., a higher resolution or pixel count) to determine whether there is damage on the pluggable module.

At block 310, the backplane connector activates a blocking element to prevent the technician from inserting the pluggable module into the connector. In one embodiment, the blocking elements is the locking pin 115 shown in FIG. 1B that uses the catches 120 to prevent the pluggable module from being plugged into the chassis. This is shown in FIG. 2B where the catches 120 extend beyond the diameter of the locking pin 115 such that the locking pin 115 cannot be slid fully into the receptacle 215, although the locking pin 115 can be partially inserted into the receptacle 215.

However, the catches are just one technique for preventing the pluggable module from being connected. For example, instead of the locking pin 115 being able to mate with the receptacle 215 as shown in FIG. 2A, the receptacle 215 may be replaced with a solid surface and the locking pin 115, as a whole, can be recessed to the left of FIG. 2A into the chassis. In this example, the catches 120 could be omitted from the locking pin 115. When in the activated state, the locking pin 115 is locked so it cannot be recessed into the chassis. Thus, when the pluggable module 205 contacts the locking pin 115, the module 205 is prevented from moving closer to the backplane connector 105. If damage is not detected in the later blocks of the method 300, then the locking pin 115 is released and the technician can apply a force with the pluggable module 205 that recesses the locking pin 115 into the chassis and permits the pluggable module 205 to be connected to the connection elements 150 on the backplane connector 105.

In another example, rather than using a locking pin, the backplane connector 105 may use flaps or covers as blocking elements that prevent the technician from inserting the pluggable module into the backplane connector. For example, when detecting the proximity of the pluggable module at block 305, the flaps or covers are activated to cover the connection elements on the backplane connector. If no damage is detected, the flaps or covers can then be raised, flipped, or slid to then expose the connection elements on the backplane connector so the technician can mate them with the connection elements of the pluggable module.

In another example, rather than using a locking pin, the backplane connector 105 can include a module cage (or module guides) which prevent the pluggable module to get inside to mate with the connector until verification is completed.

At block 315, the camera captures images of the connection elements on the pluggable module. In one embodiment, block 315 occurs while the blocking element (e.g., locking pin, catches, flaps, covers, etc.) are activated to prevent the pluggable module from being mated with the backplane connector. One advantage of using the locking pin as the blocking element is that it can ensure a proper spacing between the backplane connector and the pluggable module in order for the camera to capture images that include the connector elements in the pluggable module. However, the camera can still capture images of the pluggable module when flaps or covers are used as the pluggable module is moved closer to the chassis by the technician but before the pluggable module has contacted the flaps or covers.

In one embodiment, the inspection system can use ultrasound or infrared imaging to collect data regarding the pluggable module to verify there is no damage. In that example, the inspection system can include an ultrasound sensor or an infrared sensor arranged to face the pluggable module.

At block 320, the image processing system determines whether there is damage to the connection elements of the pluggable module. In one embodiment, the image processing system evaluates the images captured by the camera to identify the damage. The image processing system can use any suitable algorithm for detecting the damage. In one embodiment, the image processing system can use an image processing technique that looks for a specific type of damage—e.g., bent pins or broken receptacles. In another embodiment, the image processing system uses a machine learning model (e.g., a neural network) to identify the damage. The machine learning model can be trained using images of the connection members that do, and do not, have damage in order to detect damage in real time using the images captured by the camera on the backplane connector.

If damage is not detected, the method 300 proceeds to block 325 where the backplane connector releases the blocking element. In one embodiment, an indication through LED or console or both is given to the technician to indicate the inspection system has confirmed the pluggable module is not damaged. The backplane connector can unlock the catches 120 in FIG. 2B so that the locking pin 115 can slide further into the receptacle 215 as shown in FIG. 2C. This permits the connection elements on the backplane connector and the pluggable module to mate. However, the manner in which the blocking element is released will depend on the type of blocking element that is being used (e.g., catches, a recessable locking pin, flaps, covers, cages, or guides). Regardless of the type of blocking element, releasing the blocking elements permits the connection elements on the backplane connector to mate with connection elements on the pluggable module.

If at block 320 damage is detected, the method 300 proceeds to block 330 where the backplane connector keeps the blocking element active and outputs an alert. In one embodiment, an indication through LED or console or both is given to the technician to indicate the inspection system has determined that the pluggable module is damaged and should be removed. The blocking element continues to prevent the technician from mating the pluggable module with the chassis. The backplane connector may output a visual alert (e.g., a flashing red light on the backplane connector), an audio alert (e.g., several beeps), or both to inform the technician that damage was detected during the visual inspection stage at block 320.

In one embodiment, the backplane connector may have an override feature that permits the technician to view the pluggable module, determine there is actually no damage to the module, and release the blocking element so the pluggable module can be inserted. For example, the image processing system may have made a mistake and determined the pluggable module was damaged when in actuality there is no damage. This may be caused by any number of factors such as poor lighting, not being able to view all the connection members on the pluggable module, and the like. After noticing the alert, the technician can perform her own assessment of the pluggable module, and if she determines there is no damage can press an override button or switch on the backplane connector that manually releases the blocking element and permits the technician to plug in the pluggable module.

Figure 4A:
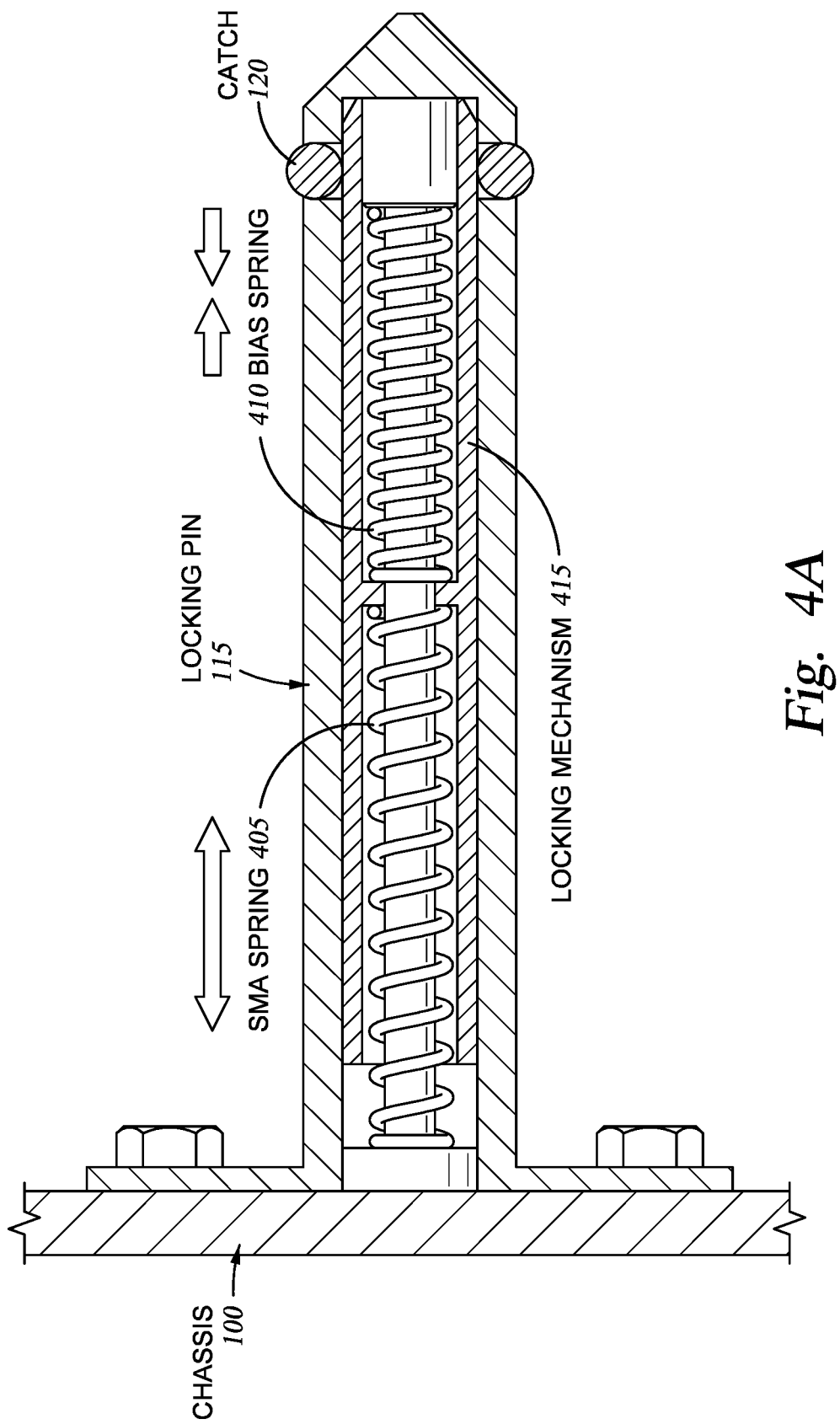
FIG. 4A illustrates an active locking pin, according to one embodiment.

FIG. 4A illustrates an active locking pin, according to one embodiment. That is, FIG. 4A illustrates the locking pin when the catches 120 are in an activated position to prevent the pluggable module from mating with the chassis. The locking pin 115 may be in the state shown in FIG. 4A in response to the proximity sensor detecting the proximity of the pluggable module as discussed at blocks 305 and 310 in the method 300.

FIG. 4A illustrates a side section view of the locking pin 115 where the outer surface has been removed to illustrate the inside of the locking pin 115. The locking pin 115 includes a shape memory alloy (SMA) spring 405 (i.e., a controllable spring), a bias spring 410, and a locking mechanism 415. As shown, a voltage and current can be applied to expand and contract the SMA spring 405. In FIG. 4A, a current causes the SMA spring 405 to expand which forces the locking mechanism 415 (e.g., a sliding frame) to the right and compresses the bias spring 410. Sliding the locking mechanism 415 to the right causes the catch 120 to protrude from the surface of the locking pin 115. Thus, as shown in FIG. 2B, when the locking pin 115 contacts the receptacle 215 of the pluggable module 205, the locking mechanism 415 prevents the catches 120 from retracting into the locking pin 115 and prevents the locking pin 115 from sliding any further into the receptacle 215.

Figure 4B:
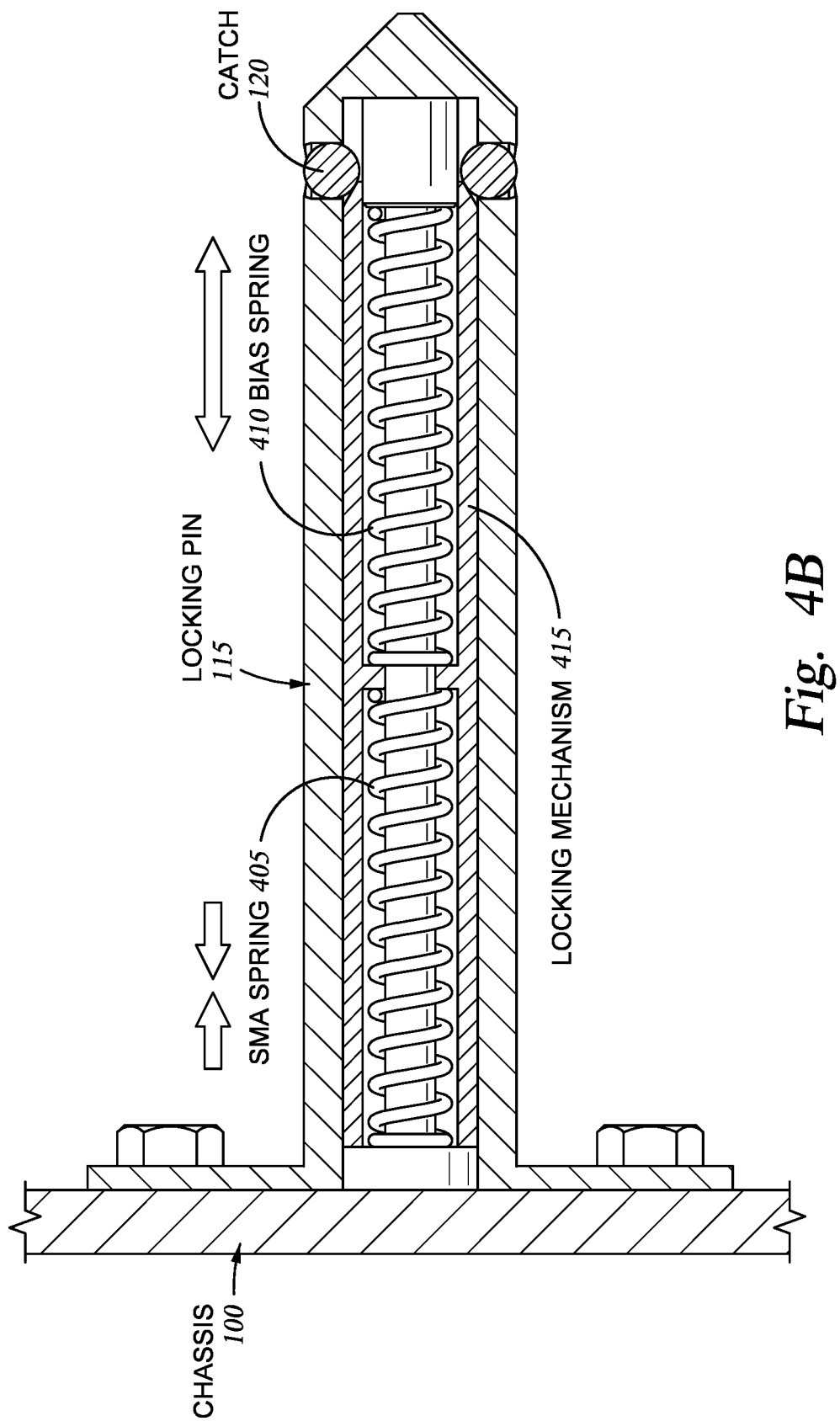
FIG. 4B illustrates a released locking pin, according to one embodiment.

FIG. 4B illustrates a released locking pin, according to one embodiment. That is, FIG. 4A illustrates the locking pin when the catches 120 are in a released position to enable the pluggable module to mate with the chassis. The locking pin 115 may be in the state shown in FIG. 4B in response to the image processing system determining there is no damage on the connection elements of the pluggable module as discussed at blocks 320 and 325 in the method 300.

Here, the current is reduced, removed, or applied in the opposite direction (e.g., using a reverse voltage) which causes the SMA spring 405 to compress or shrink (e.g., move to its neutral (uncompressed) compression state). That is, the SMA spring 405 no longer applies a force to move the locking mechanism 415 to the right.

Because the bias spring 410 was compressed by the SMA spring 405 in FIG. 4A, when the SMA spring 405 shrinks, the bias spring 410 applies a force on the left of the locking mechanism 415 that slides the locking mechanism 415 to the left. The bias spring 410 may apply some compression force on the SMA spring 405, or both the bias spring 410 and the SMA spring 405 may be in uncompressed states in FIG. 4B. In any case, the locking mechanism 415 is no longer underneath the catches 120. As such, as a technician continues to apply a force to the pluggable module, this force recesses the catches 120 into the locking pin 115. Thus, the catches 120 no longer prevent the pluggable module from mating with the backplane connector. In this manner, FIGS. 4A and 4B illustrate one example of a system for activating and releasing the locking pin 115 and the catches 120.

In one embodiment, the SMA spring 405 and the bias spring 410 can be interchanged where the SMA spring remains in uncompressed state and due to force of bias spring, the locking mechanism 415 remains biased towards the right to keep the catches 120 in the locking position. After successful verification, current is supplied to SMA spring causing it to expand which moves the locking mechanism 415 towards the left making space for the catches 120 to recess inside the locking pin 115.

FIG. 5 illustrates an inspection system with a camera 560 on the pluggable module 550, according to one embodiment. That is, instead of having only the camera 135 on the backplane connector 500, the inspection system includes the camera 560 on the pluggable module 550. While the camera 135 captures images for detecting damage on the pluggable module 550, the camera 560 captures images for detecting damage on the backplane connector 500. For example, the images captured by the camera 560 can include the connection elements 150 on the backplane connector 500. Thus, by processing these images, the image processing system can determine whether the connection elements 150 are damaged (e.g., bent pins, broken receptacles, burnt components).

The backplane connector 500 includes an electrical interface 510 that is used to transmit power and data signals to an electrical interface 555 on the pluggable module 550. For example, as the pluggable module 550 is brought into proximity of the backplane connector like as shown in FIG. 2B (where the receptacle 215 contacts the catches on the locking pin 115), the interface 510 contacts the interface 555 so that power and/or communication signals can be transmitted between the backplane connector 500 and the pluggable module 550.

In one embodiment, the interfaces 510 and 555 are used to provide power to the pluggable module 550 to power the camera 560 so the camera 560 can capture images of the backplane connector 500. Further, the interfaces 510 and 555 can be used to transmit data signals such as commands that instruct the camera 560 when to capture the images and when to stop capturing the images. Further, the interfaces 510 and 555 can be used to transmit the images from the pluggable module 550 to the backplane connector 500, where the backplane connector 500 can then forward the images to the image processing system to identify any damage.

The inspection system in FIG. 5 may release the locking pin 115 (e.g., release the catches) after determining from the images captured by the cameras 135 and 560 that there is no damage on either the backplane connector 500 or the pluggable module 550. If there is damage on either device, then the locking pin 115 remains activated (locked) to prevent the connection elements 210 on the pluggable module 550 from contacting the connection elements 150 on the backplane connector 500. Thus, the method 300 can be performed using both the cameras on the backplane connector 500 and the camera on the pluggable module 550 to determine whether there is damage on either the chassis or the pluggable module.

While FIG. 5 illustrates both the backplane connector 500 and the pluggable module 550 having cameras, in one embodiment, there may only be the camera 560 on the pluggable module.

In one embodiment, the interfaces 510 and 555 may be used to transmit only power to the camera 560. The camera 560 can use a different communication channel, such as a wireless communication channel to transmit the images to the image processing system. For example, the camera can use a short-range wireless communication technique to transmit images to the backplane connector 500.

In another embodiment, instead of using the interfaces 510 and 555 to transmit power for the camera 560, the pluggable module 550 may include a battery that powers the camera 560 and enables the captured images to be wirelessly transmitted to the image processing system.

In yet another embodiment, the locking pin 115 may be disposed on the pluggable module 550 rather than the backplane connector 500. In that case, the interfaces 510 and 55 can be used to transmit signals to the pin to lock or release the pin 115. For example, once the interfaces 510 and 555 contact as the pluggable module 550 is brought towards the backplane connector 500, the connector 500 can instruct the locking pin to lock the catches to prevent the pluggable module 550 from moving any closer to the backplane connector 500 until the cameras 135 and 560 are able to capture images which are then evaluated to detect whether there is damage. If there is no damage, then the backplane connector 500 releases the locking pin on the pluggable module 550 so the technician can finish plugging in the module 550.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
    detecting that a module is proximate to a computing device;
    activating a blocking element to prevent a first connector element in the module from mating with a second connector element in the computing device;
    while the blocking element is activated, capturing an image of at least one of the first connector element or the second connector element; and
    upon determining, using an image processing system, that the at least one of the first connector element or second connector element is not damaged, releasing the blocking element, thereby permitting the first connector element to mate with the second connector element.

2. The method of claim 1, wherein the blocking element, when activated, establishes a separation distance between the module and the computing device, wherein a camera on the module or the computing device captures the image when the blocking element has been partially inserted into one of the module or the computing device.

3. The method of claim 1, further comprising:
    illuminating, when capturing the image, the at least one of the first connector element or the second connector element using a light source disposed on the module or the computing device.

4. The method of claim 1, wherein the blocking element comprises a controllable spring for causing a catch to protrude from a surface of the blocking element to prevent the first connector element in the module from mating with a second connector element in the computing device.

5. The method of claim 4, wherein the catch is a ball disposed proximate to an end of the blocking element, wherein the ball is retracted into the blocking element upon determining that the at least one of the first connector element or the second connector element is not damaged.

6. The method of claim 1, wherein detecting that the module is proximate to the computing device comprises:
    detecting that the module has been brought into proximity of the computing device using a proximity sensor disposed on the computing device, wherein the blocking element is activated in response to the proximity sensor detecting the module.

7. A computing device: comprising:
    a first connector element configured to mate with a second connector element on a pluggable module;

a camera configured to capture images of the second connector element before the pluggable module mates with the first connector element;

a blocking element configured to prevent the first connector element from mating with the second connector element in the pluggable module; and an image processing system configured to evaluate the images to determine whether there is damage on the pluggable module, wherein the computing device is configured to release the blocking element in response to determining there is no damage on the pluggable module.

8. The computing device of claim 7, wherein the blocking element, when activated, establishes a separation distance between the computing device and the pluggable module, wherein the camera captures the images when the blocking element has been partially inserted into a receptacle on the pluggable module.

9. The computing device of claim 7, further comprising:
a light configured to illuminate the pluggable module as the camera captures the images.

10. The computing device of claim 7, wherein the blocking element comprises a controllable spring for causing a catch to protrude from a surface of the blocking element to prevent the first connector element from mating with the second connector element.

11. The computing device of claim 10, wherein the catch is a ball disposed proximate to an end of the blocking element, wherein the ball is retracted into the blocking element in response to determining that the pluggable module is not damaged.

12. The computing device of claim 7, further comprising:
a proximity sensor configured to detect the pluggable module, wherein the computing device is configured to activate the blocking element to prevent the first connector element from mating with the second connector element in response to the proximity sensor detecting the pluggable module.

13. The computing device of claim 7, wherein the first connector element, the camera, and the blocking element are disposed on a backplane connector of a chassis of the computing device.

14. The computing device of claim 7, wherein the image processing system is configured to:
receive a different image from a camera disposed on the pluggable module; and
evaluate the different image to determine whether the first connector element on the computing device is damaged, wherein the computing device is configured to release the blocking element in response to determining there is no damage on the first connector element.

15. The computing device of claim 14, further comprising:
a first electrical interface for providing power to the camera disposed on the pluggable module, wherein the first electrical interface is configured to contact a second electrical interface on the pluggable module when the pluggable module is proximate to the computing device but is being prevented by the blocking element from being plugged into the computing device.

16. A system, comprising:
a computing device;
a pluggable module, wherein a first connector element on the computing device is configured to mate with a second connector element on the pluggable module;
a camera configured to capture images of the computing device or the pluggable module before the pluggable module mates with the first connector element;
a blocking element disposed on the computing device or the pluggable module, the blocking element is configured to prevent the first connector element from mating with the second connector element in the pluggable module; and
an image processing system configured to evaluate the images to determine whether there is damage on the computing device or the pluggable module, wherein the computing device is configured to release the blocking element in response to determining there is no damage on the computing device or the pluggable module.

17. The system of claim 16, wherein the blocking element, when activated, establishes a separation distance between the computing device and the pluggable module, wherein the camera captures the images when the blocking element has been partially inserted into a receptacle on the pluggable module.

18. The system of claim 16, wherein the camera is disposed on the computing device, the computing device further comprising:
a light configured to illuminate the pluggable module as the camera captures the images.

19. The system of claim 16, further comprising:
a proximity sensor configured to detect the pluggable module, wherein the computing device is configured to activate the blocking element to prevent the first connector element from mating with the second connector element in response to the proximity sensor detecting the pluggable module.

20. The system of claim 16, further comprising:
an ultrasound sensor or an infrared sensor configured to provide data to determine whether there is damage on the computing device or the pluggable module.

* * * * *